United States Patent [19]

Heaps et al.

[11] 4,128,680
[45] Dec. 5, 1978

[54] SILICON COATED CERAMIC SUBSTRATE WITH IMPROVEMENTS FOR MAKING ELECTRICAL CONTACT TO THE INTERFACE SURFACE OF THE SILICON

[75] Inventors: Joseph D. Heaps, Minnetonka; Obert N. Tufte, Prior Lake, both of Minn.

[73] Assignee: Honeywell Inc., Minneapolis, Minn.

[21] Appl. No.: 803,010

[22] Filed: Jun. 3, 1977

[51] Int. Cl.² ............................ B32B 3/10; B32B 9/04; B32B 13/04; B05D 5/12
[52] U.S. Cl. ................................... 428/137; 428/131; 428/134; 428/446; 427/93; 427/97; 427/122
[58] Field of Search ............... 428/63, 105, 131, 134, 428/136, 137, 408, 446, 538; 427/93, 97, 95, 122, 290, 430 B, 123, 227, 203, 266; 126/270, 271

[56] References Cited

U.S. PATENT DOCUMENTS

| | | | |
|---|---|---|---|
| 3,576,669 | 4/1971 | Filip | 427/430 B X |
| 3,676,179 | 7/1972 | Bokros | 428/446 X |
| 3,990,914 | 11/1976 | Weinstein | 126/270 X |
| 4,071,878 | 1/1978 | Stynes | 428/137 X |

Primary Examiner—George F. Lesmes
Assistant Examiner—Daniel R. Zirker
Attorney, Agent, or Firm—Omund R. Dahle

[57] ABSTRACT

When electrically insulating ceramic substrates are coated with silicon by any of a number of methods that brings the substrate into contact with molten silicon, electrical contact can only be made conveniently to the exposed surface of the silicon coating. This invention teaches an improvement for making electrical contact to the interface surface of the silicon. It was discovered that by providing narrow slits or small holes in the ceramic substrate that upon coating the substrate with molten silicon, molten slicon will wick through the slits or holes to the uncoated surface of the ceramic.

6 Claims, 5 Drawing Figures

U.S. Patent  Dec. 5, 1978  4,128,680
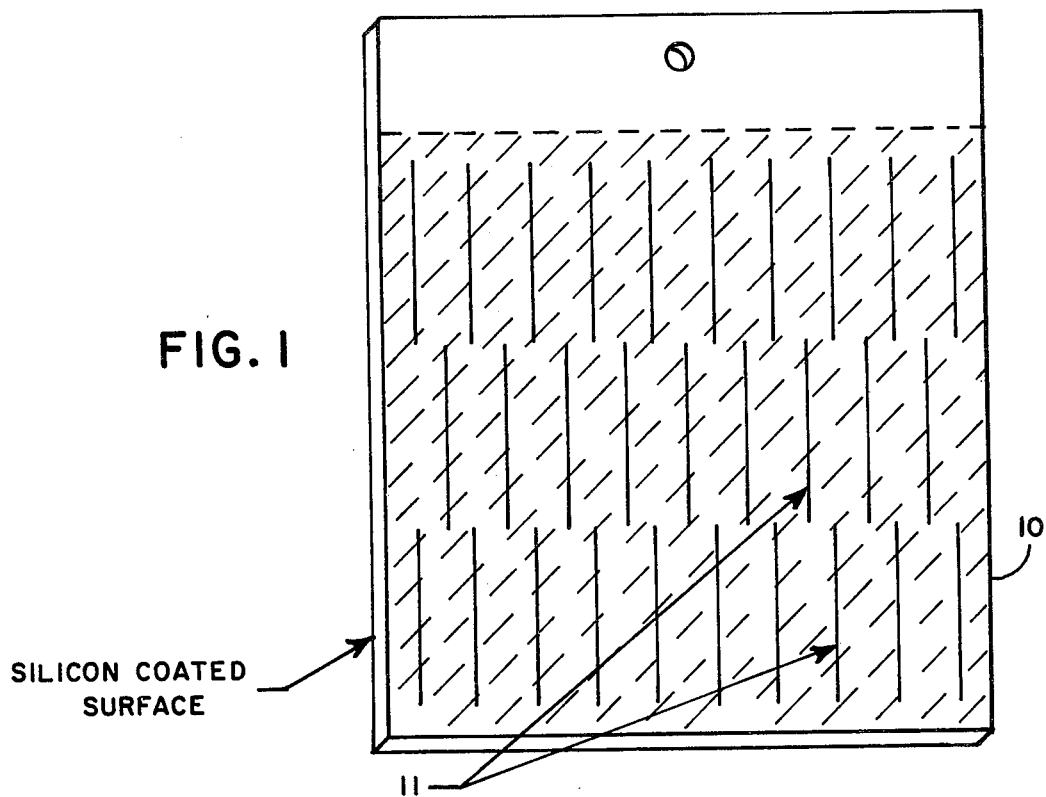
FIG. 1
SILICON COATED SURFACE
10
11
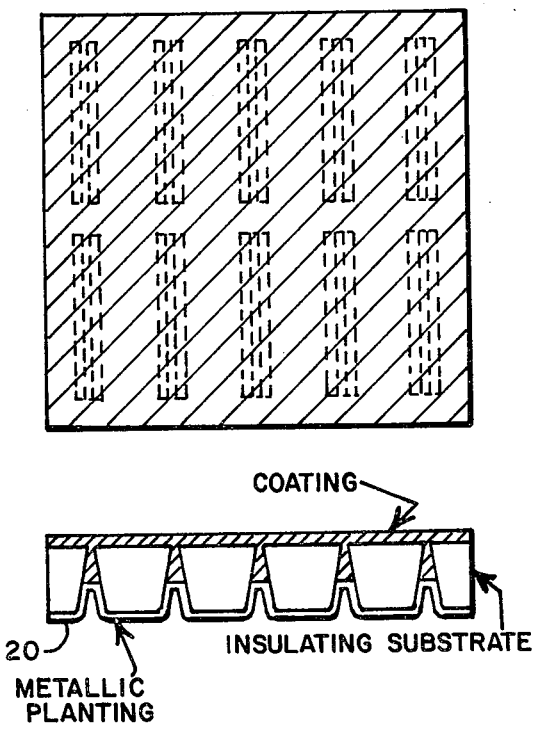
FIG. 2
COATING
20 — METALLIC PLANTING
INSULATING SUBSTRATE
FIG. 3
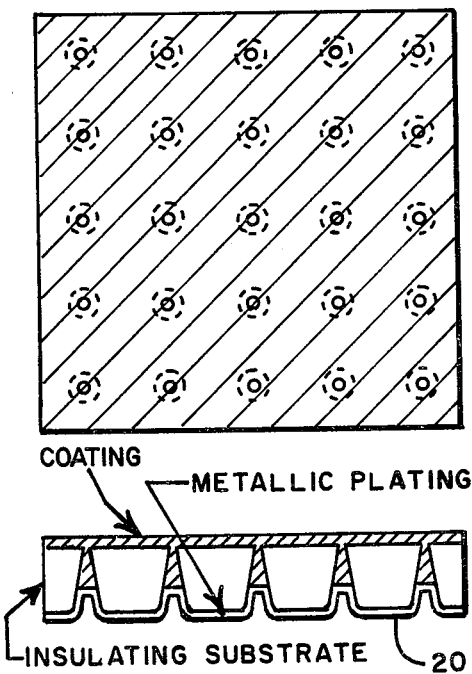
FIG. 4
COATING — METALLIC PLATING
INSULATING SUBSTRATE
20
FIG. 5

SILICON COATED CERAMIC SUBSTRATE WITH IMPROVEMENTS FOR MAKING ELECTRICAL CONTACT TO THE INTERFACE SURFACE OF THE SILICON

BACKGROUND & SUMMARY OF THE INVENTION

In the co-pending patent application Ser. No. 748,982, filed Dec. 9, 1976 in the names of Joseph D. Heaps and Obert N. Tufte, entitled "Method for Dip-Coating Ceramic with Molten Silicon" and assigned to the same assignee as the present invention, there is described a method for dip-coating ceramic bodies or sheets with molten silicon to prepare large area, thin sheets of large grain polycrystalline silicon for use in solar panels and the like. In that method the side of the ceramic sheet or the area to be coated with silicon is first carbonized since molten silicon does not otherwise wet ceramic. When electrically insulating ceramic substrates of that nature are coated with silicon by that method or other methods that bring the ceramic sheet into contact with the molten silicon, electrical contact can only be made conveniently to the exposed or top surface of the large area silicon coating. If the silicon coating is used for fabricating two-layer devices, such as solar cells, the bottom or interface layer is inaccessible to making electrical contact without sacrificing a portion of the top surface area for cutting or etching through the layer to reach the bottom layer thereby making the bottom layer accessible to electrical contacting. In order to minimize the solar cell's internal series resistance, good contact must be made to this bottom layer without utilizing any of the solar cell's top surface and thereby waste the effective area upon which solar radiation falls.

In the present invention it was discovered that by providing narrow slits or small holes in the ceramic substrate that upon coating one side of the ceramic substrate with molten silicon, the molten silicon will wick through the slits or holes to provide electrical contact points to the bottom layer of the silicon at the uncoated side of the substrate. Although the concise term "wick through" is used throughout the specification and claims, a more precise explanation of the action of the molten silicon might be that the silicon will be drawn by surface tension through the slits or holes.

BRIEF DESCRIPTION OF THE DRAWINGS

FIG. 1 is a pictoral layout of the back side of a silicon-coated ceramic substrate, the substrate having slits allowing wick through of silicon during coating.

FIGS. 2 and 3 are top and edge view of one embodiment of the slits of FIG. 1 in greater detail.

FIGS. 4 and 5 are top and edge view of holes in greater detail.

DESCRIPTION

In the above-mentioned co-pending application Ser. No. 748,982, there is described a ceramic substrate having a dip-coated layer of large grain polycrystalline silicon for use as solar cells or the like. Since ceramics when dipped into molten silicon are not wet by the silicon, a carbonizing of the surface of the ceramic to be silicon coated is first done to make the ceramic surface wettable by the silicon. The desired large grain polycrystalline layer of silicon on ceramic which results can then be further processed to prepare the desired P & N type regions. Because the dip-coated layers are backed by the electrically insulating ceramic substrate, conventional contact to the base layer is not possible. Contact could be made to both the P & N type regions of the solar cell via the top surface, but this is not desirable because it requires sacrificing a portion of the top surface area, the effective area upon which solar radiation falls.

In FIG. 1 there is shown a sheet of ceramic substrate 10, such as mullite for example. In this Figure is seen the back side or uncoated side of the substrate. A number of narrow slits 11 are preformed in the ceramic substrate. In one specific embodiment the slits are in line with the direction of crystalline growth of the silicon coating. In the device of FIG. 1, the substrate is carbonized on the reverse side from that shown, the carbonized substrate is dipped into (or the carbonized surface is otherwise brought into contact with) molten silicon and as the substrate is withdrawn from the silicon melt (or the carbonized surface is otherwise progressively contacting molten silicon) and the large grain polycrystalline silicon layer is coated on the carbonized portion of the ceramic, the silicon wicks through the slits 11 from the coating towards the uncoated side. Electrical contact can then be made to the silicon in the slits thus providing the needed communication with the base layer. The narrow slits may vary in dimension depending upon the particular substrate chosen and the thickness of the substrate. As an example, the slits may be about 0.003 inch – 0.03 inch in width. It is important that the slits be relatively narrow so that the crystalline grain growth of the silicon coating is minimally disturbed.

In FIGS. 2 and 3 there is shown an enlargement of a portion of FIG. 1 to show in more detail one embodiment of the slits 11. The slits may be uniform in width through the substrate as in FIG. 1; however, in this embodiment the slits are shown as being somewhat V-shaped, being wider on the back side of the substrate than on the silicon coated side. The V-shaped slits may be preferable on thick substrates to allow the silicon to wick all the way through the substrate and to provide a greater conductivity path. In FIGS. 4 and 5 there is shown a modification in which holes instead of slits are disclosed in the substrate. As an example, the holes may be about 0.003 inch – 0.03 inch in diameter. In addition, although the holes may be cylindrical, these holes are shown as being somewhat cone-shaped or countersunk shaped for the same reason as the V-shaped slits. FIGS. 3 and 5 show the wicking of the silicon through the slits and holes.

The number of holes or slits are dependent upon the conductivity requirement of the device's bottom layer. A subsequent metallic coating 20, such as silver, aluminum or copper, can then be plated or deposited on the back surface of the substrate thus electrically connecting all of the silicon which has wicked through the holes or slits in the substrate.

The embodiments of the invention in which an exclusive property or right is claimed are defined as follows:

1. A crystalline silicon coated ceramic substrate providing electrical contacts to the interface surface of the silicon coating from the substrate side comprising:
    a ceramic substrate having narrow openings through the thickness of said substrate from front face to back face thereof;
    a layer of crystalline silicon grown onto the front face of said ceramic substrate and through said openings by contacting said front face with molten silicon to form said silicon layer, said silicon layer while still molten also wicking through said narrow openings from said layer on said front face towards said back face to thereby provide electrical contacts to the interface surface of the silicon layer from the substrate side.

2. A crystalline silicon coated ceramic substrate providing electrical contacts to the interface surface of the silicon coating from the substrate side comprising:

a ceramic substrate having narrow openings through the thickness of said substrate from front face to back face thereof;

an interface layer comprising carbon on at least a portion of the front face of said substrate to render said front face portion wettable by molten silicon; and, a layer of crystalline silicon grown onto the carbonized front face of said ceramic substrate and through said openings by contacting said front face with molten silicon to form said silicon layer, said silicon layer while still molten also wicking though said narrow openings from said layer on said front face towards said back face to thereby provide electrical contacts to the interface surface of the silicon layer from the substrate side.

3. A method of making electrical contact to the interface surface of silicon coated on an insulating ceramic substrate comprising the steps of:

providing an insulating ceramic substrate to be coated;

providing narrow openings through the thickness of said insulating substrate from front face to back face thereof;

providing in molten state a quantity of silicon to be coated on said substrate;

coating at least a portion of the front face of saud substrate by bringing it into contact with said molten silicon whereupon said molten silicon also wicks through said narrow openings from said coating towards said back face so that electrical contact can be made to the interface surface of said material from the back face by way of the silicon which wicks through said openings.

4. The method according to claim 3 wherein said openings are narrow slits.

5. The method according to claim 3 wherein said openings are holes.

6. The method according to claim 3 and further comprising the step of:

carbonizing at least a portion of the front face of said substrate to thereby provide areas on the substrate which will be wet by molten silicon.

* * * * *